(12) United States Patent
Böhler et al.

(10) Patent No.: US 10,955,492 B2
(45) Date of Patent: Mar. 23, 2021

(54) TEST SYSTEM FOR CHECKING ELECTRICAL CONNECTIONS OF ELECTRONIC COMPONENTS TO A PRINTED CIRCUIT BOARD

(71) Applicant: Endress+Hauser Flowtec AG, Reinach (CH)

(72) Inventors: Thomas Böhler, Kandern (DE); Matthias Brudermann, Moehlin (CH); Christoph Werle, Liestal (CH); Markus Wucher, Lörrach (DE); Daniel Kollmer, Maulburg (DE); Ludovic Adam, Chalampé (FR)

(73) Assignee: Endress+Hauser Flowtec AG, Reinach (CH)

( * ) Notice: Subject to any disclaimer, the term of this patent is extended or adjusted under 35 U.S.C. 154(b) by 22 days.

(21) Appl. No.: 16/321,961

(22) PCT Filed: Jul. 14, 2017

(86) PCT No.: PCT/EP2017/067813
§ 371 (c)(1),
(2) Date: May 8, 2019

(87) PCT Pub. No.: WO2018/024464
PCT Pub. Date: Feb. 8, 2018

(65) Prior Publication Data
US 2019/0265290 A1    Aug. 29, 2019

(30) Foreign Application Priority Data

Aug. 1, 2016 (DE) ................ DE10 2016 114 145.3

(51) Int. Cl.
*G01R 31/71* (2020.01)
*G01R 31/28* (2006.01)
*H01L 21/00* (2006.01)

(52) U.S. Cl.
CPC ......... *G01R 31/71* (2020.01); *G01R 31/2808* (2013.01)

(58) Field of Classification Search
CPC ....... H01L 21/00; H01L 2221/00; G01R 1/00; H02H 1/00
See application file for complete search history.

(56) References Cited

U.S. PATENT DOCUMENTS 6,259,265 B1    7/2001   Han et al.
7,319,341 B1 *  1/2008   Harms ............... G01R 1/06794
                                                       324/754.28

(Continued)

FOREIGN PATENT DOCUMENTS

CN          2804873 Y        8/2006
CN        201345474 Y       11/2009

(Continued)

OTHER PUBLICATIONS

International Search Report for Patent Application No. PCT/EP2017/067813, WIPO, dated Nov. 28, 2017, 10 pp.

(Continued)

*Primary Examiner* — Jermele M Hollington
*Assistant Examiner* — Temilade S Rhodes-Vivour
(74) *Attorney, Agent, or Firm* — Mark A. Logan; Endress+Hauser (USA) Holding Inc.

(57) ABSTRACT

A test system for testing electric connections, in particular soldered connections, between electronic components and a printed circuit board to be tested, characterized in that the test system includes a subassembly, which is movably mounted in a housing of the test system, and a current and/or voltage source for energizing the circuit board to be tested, the current and/or voltage source being arranged in the housing of the test system in such a way as to be movable in at least two directions in space.

8 Claims, 8 Drawing Sheets

(56) References Cited

U.S. PATENT DOCUMENTS

| | | | |
|---|---|---|---|
| 2005/0099173 A1 | 5/2005 | Siade et al. | |
| 2006/0107118 A1 | 5/2006 | Alperin et al. | |
| 2007/0001790 A1* | 1/2007 | Richmond, II | G01R 31/2851 |
| | | | 335/2 |
| 2007/0069745 A1 | 3/2007 | Lou et al. | |
| 2007/0296422 A1* | 12/2007 | Miller | G01R 31/2889 |
| | | | 324/754.07 |
| 2009/0267627 A1 | 10/2009 | Miller | |
| 2015/0016200 A1* | 1/2015 | Cha | G11C 11/4096 |
| | | | 365/189.11 |
| 2016/0141011 A1* | 5/2016 | Lee | G11C 16/0483 |
| | | | 365/201 |
| 2016/0379921 A1* | 12/2016 | Shin | H01L 23/49838 |
| | | | 257/676 |

FOREIGN PATENT DOCUMENTS

| | | |
|---|---|---|
| CN | 103076553 A | 5/2013 |
| CN | 103792481 A | 5/2014 |
| CN | 204479734 U | 7/2015 |
| CN | 204832257 U | 12/2015 |
| CN | 105676110 A | 6/2016 |
| CN | 105738797 A | 7/2016 |
| EP | 0633478 A2 | 1/1995 |

OTHER PUBLICATIONS

Search Report for German Patent Application No. 10 2016 114 145.3, German Patent Office, dated Apr. 28, 2017, 7 pp.

\* cited by examiner

TEST SYSTEM FOR CHECKING ELECTRICAL CONNECTIONS OF ELECTRONIC COMPONENTS TO A PRINTED CIRCUIT BOARD

CROSS-REFERENCE TO RELATED APPLICATIONS

The present application is related to and claims the priority benefit of German Patent Application No. 10 2016 114 145.3, filed on Aug. 1, 2016 and International Patent Application No. PCT/EP2017/067813 filed on Jul. 14, 2017, the entire contents of which are incorporated herein by reference.

TECHNICAL FIELD

The present invention relates to a test system for checking electrical connections, in particular soldered connections, between electronic components having a circuit board.

BACKGROUND

EP 0 633 478 A2 discloses a test system for checking electronic connections of electronic assemblies with a circuit board to be tested.

Such test systems were developed successively. Thus, the electrodes by joints and/or robot arms can be brought to the circuit board and determine, for example. by resistance measurement, whether a solder joint is positioned correctly and an electrical contacting of the electronic components of the circuit board can be done via this solder joint.

Increasingly, circuit boards are now equipped with communication modules, e.g. USB or Ethernet plug connections are also provided to enable data transfer between other printed circuit boards or external electronic devices with the printed circuit board electronic components, in particular with one or more data memories located on the printed circuit board.

For this purpose, the current generic test systems have no possibility of functional testing.

Based on the prior art, it is now an object of the present invention to enable an optimized data transmission of the test system to the circuit board.

The present invention solves this object by a test system having the features of claim 1.

A test system according to the invention is used to check electrical connections, in particular solder joints, between electronic assemblies and a circuit board to be tested. This can be effected for example by resistance measurement by test pins or electrodes.

The test system also has an assembly movably mounted in a housing of the test system and a current and/or voltage source for supplying power to the assembly. The current and/or voltage source is movably arranged in at least two spatial directions within the housing of the test system but may preferably also be movably arranged in three spatial directions. The current and/or voltage source may also have a control characteristic in a preferred embodiment. As a result, the current and/or voltage source can be brought closer to the printed circuit board and, for example, measuring devices or repair devices, e.g. soldering tools, provide a voltage with fewer line losses. Measuring devices, e.g. test electrodes, temperature sensors and/or communication interfaces can thereby achieve a better measurement signal or data transmission. In the case of repair tools, the amount of energy delivered, for example for soldering, can be adjusted more precisely. In existing test systems, the voltage and/or current supply usually takes place via power sources permanently fixed in the housing. However, especially when transferring data to the printed circuit board, line losses lead to a reduction of the transmission power. The same also applies in part to the transmission of measured values.

Other advantageous embodiments of the invention are the subject matter of the dependent claims.

In a particularly preferred embodiment variant, the module can be designed as a communication interface, in particular for data transmission of data according to a communication protocol between the circuit board to be tested or checked and the test system. Due to the proximity of the current and/or voltage supply, an almost lossless and fast data transfer is possible.

The assembly may be configured as a test module. The test module can preferably have a printed circuit board, wherein the current and/or voltage source is fixedly connected on this circuit board or connected to this circuit board.

The communication interface may advantageously have at least three electrically conductive contact tips which, by contacting with a contacting arrangement on the circuit board to be tested with a plurality of, in particular metallic, contacting points, allow a data exchange with the data memory of the circuit board to be checked, whereby the data exchange takes place according to a communication protocol.

Via at least two of the contact tips, a differential data feed to the printed circuit board to be tested can advantageously take place, and via at least two further contact tips, a differential data return to the printed circuit board can take place.

The communication interface can be permanently connected to a test module, which is movably arranged in at least two spatial directions in the housing of the test system.

The current and/or voltage source can also be part of the test module. In this part, the further assembly is for example the communication interface The current and/or voltage source can be arranged at a discrete distance from the contact tips and have a readback line extending between the current and/or voltage source and at least one of the contact tips to compensate for line resistance and voltage variations.

The test module and the communication interface to which the current and/or voltage source is connected may be mounted on the underside and leading to the printed circuit board.

The current and/or voltage source can be controlled with regard to an output voltage and/or with regard to a current limitation.

The test module may have a transformer module with a transformer, with which a galvanic isolation to the communication module is realized on the circuit board to be tested and ensures an adjustment in the sense of an Ethernet connection, in particular independently thereof, whether or not there is another electrical connection to an Ethernet socket with the communication module.

BRIEF DESCRIPTION OF THE DRAWINGS

The invention will be explained in more detail with reference to several embodiments and with the aid of the accompanying figures.

DETAILED DESCRIPTION

Test systems for testing electronic circuit boards are known per se. They are used to test the operation of individual electronic components, which are arranged on the circuit board and soldered to it. Furthermore, a corresponding test system is used to test the electrical connections between the electronic components or the electronic components with each other and with the conductor lines of the printed circuit board.

Figure 1:
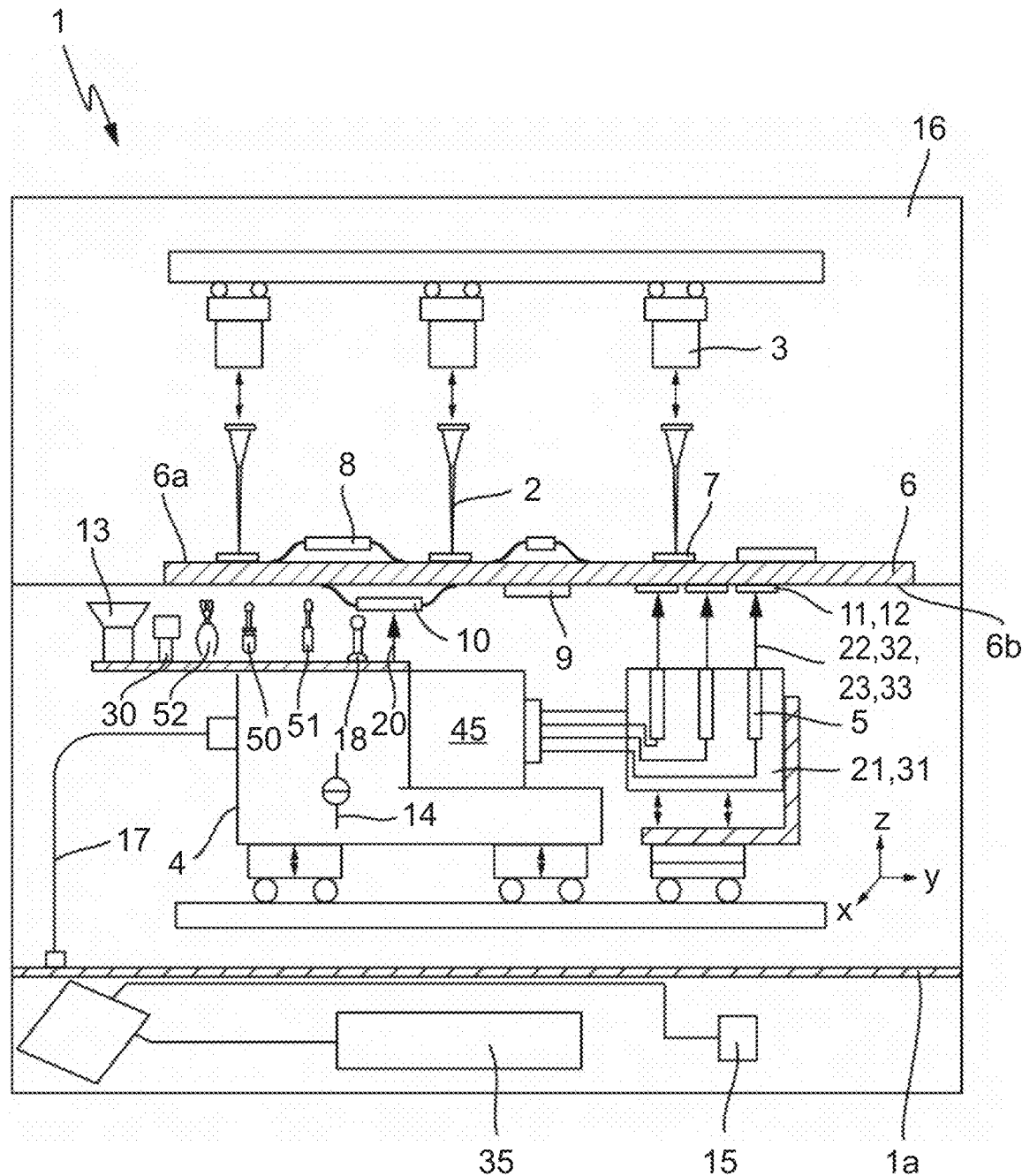
FIG. 1 shows, according to the invention, a schematic representation of an axis-controlled test system for testing electronic circuit boards.

FIG. 1 shows the test system 1 according to the invention for testing electronic circuit boards, wherein a respective circuit board 6 to be tested has a number of integrated circuits 8 on the upper side 6a of the circuit board 6.

Above the circuit board to be tested by the test system 1 at least one pin-like probe 2, preferably several pin-like probes 2, are introduced. These probes can preferably be formed as electrodes. The leading of the probe or probes can be effected, for example, by robot arms 3 which are located above the circuit board 6 to be tested freely in the x, y and z-plane, e.g. be moved by movable telescopic arms or by x, y and z linear motorized articulated arms, movable to or from contact points 7 of the circuit board. Resistance values can be determined at these contact points 7.

The robot arms 3 can be designed, for example, as linearly guided slides which have one or more joints, so that the pin-like probes 2 can be brought to the circuit board from above or from several axes.

Below the printed circuit board 6 to be tested, a test module 4 is arranged, which is part of the test system 1 and can be moved toward an underside 6b of the printed circuit board 6. The test module 4 is thus arranged movable analogously in the x, y and z direction with respect to the printed circuit board 6. This is made possible, for example, in the x and y directions by linear guidance, for example by linear guided sliding rails or so-called linear tables. This can be done in particular by a roller, chain or cable pull guide. This x- and y-linear guide can then be moved in the z direction, that is to say perpendicular to the board plane of circuit board 6 by a robot arm or another linear guide movable.

Alternatively, the printed circuit board 6 can also be arranged to be movable relative to the test module 4 and/or the pin-like test probes 2. In this case, the test system 1 has a holder which is movable at least in the x- and y-direction, possibly also in the z-direction, e.g. is movably supported by a height-adjustable linear table.

The test module 4 can thus be brought from below onto the printed circuit board 6. Unlike the individual test probes brought up from above, which check the electrical connection of the electronic components to the printed circuit board 6, the test module undertakes a test of the functional test, e.g. the data transmission of a communication module 9 of the circuit board 6.

The test module 4 has a communication interface 5 for communication with the communication module 9 of the circuit board 6 to be tested. By means of the communication interface 5, a programming of a data memory 10 arranged on the circuit board 6 to be tested can be carried out by the test system 1. In this way, the test system can store data on the data memory, for example a serial number, an IP/Mac address, as well as factory-set adjustment individual values and/or data records. Two preferred variants of a communication interface 5 are shown in FIG. 4 and FIG. 5.

Figure 4:
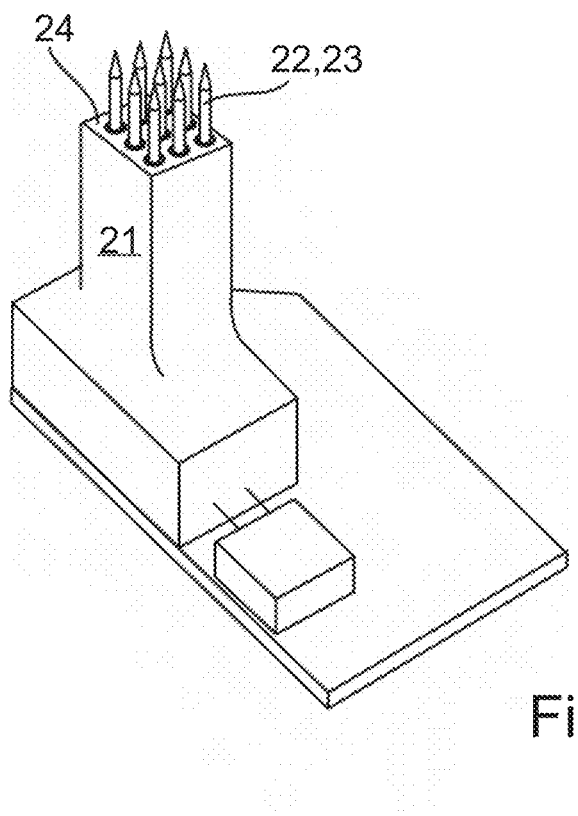
FIG. 4 shows, according to the invention, a schematic representation of a first variant of a communication interface as part of the test system.
Figure 5:
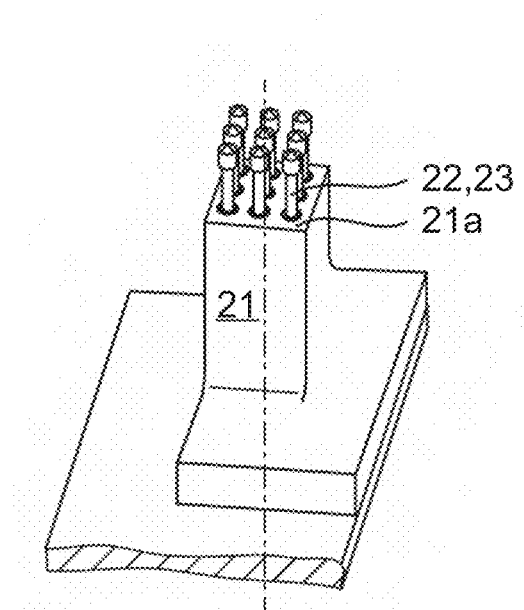
FIG. 5 shows, according to the invention, a schematic representation of a second variant of a communication interface as part of the test system.

In FIG. 4, the communication interface 5 preferably has a housing section 21 and a plurality of contact tips 22 which protrude in the form of an array arrangement 23 from an end face 24 of the housing section 21. The contact tips 22 of the array arrangement 23 are arranged in a rectangular arrangement with a total of nine contact tips. The housing section 21 is mounted on a circuit board, which may be the test module 4 or a remote from the test module 4 board, which is connected via data lines and power supply lines and preferably also via a fixed mechanical connection with the test module 4.

Thus, the power supply and the data line of the communication interface in a preferred embodiment of the invention occur directly through the test module 4 and arranged thereon or connected components, long data transmission paths are avoided and the signal quality in the data transfer and the transmission speed can be increased.

The array arrangement 23 serves for contacting the communication module 9 on the circuit board to be tested. In this case, the circuit board 9 has metallic contacting regions 11. The contacting regions 11 are punctiform or rectangular segments, which are spaced apart from one another and have the same arrangement as the contact tips 22 of the array arrangement 23.

The contact tips 22 are spring-mounted in the housing section, so that they retract to a part in the housing section 21 when contacting with the contacting areas 11 of the printed circuit board 6. Due to the resilience or the retractability and extendability of the contact tips 22 in the housing section, bending of the contact tips 22 and damage to the contacting regions 11 of the printed circuit board 6 can be prevented. The contact tips 22 can be held via at least one locking element in a retracted position, in which a spring, with which the spring-loaded contact tip 22 cooperates, is compressed and thus tensioned. Thus, it is possible to change the array arrangement, i.e. the number of fully extended contact tips, and thus to adapt to the number of contacting regions 11 of the printed circuit board. If more contact tips 22 are available as corresponding contacting regions 11, then rigidly protruding, i.e. non-resiliently mounted contact tips would rest on an exposed surface of the printed circuit board, causing damage to both the contact tips 22 and scratching of the circuit board. This is advantageously prevented by the detectable retractability and extensibility of individual contact tips 22 from or into the housing section 21.

Figure 2:
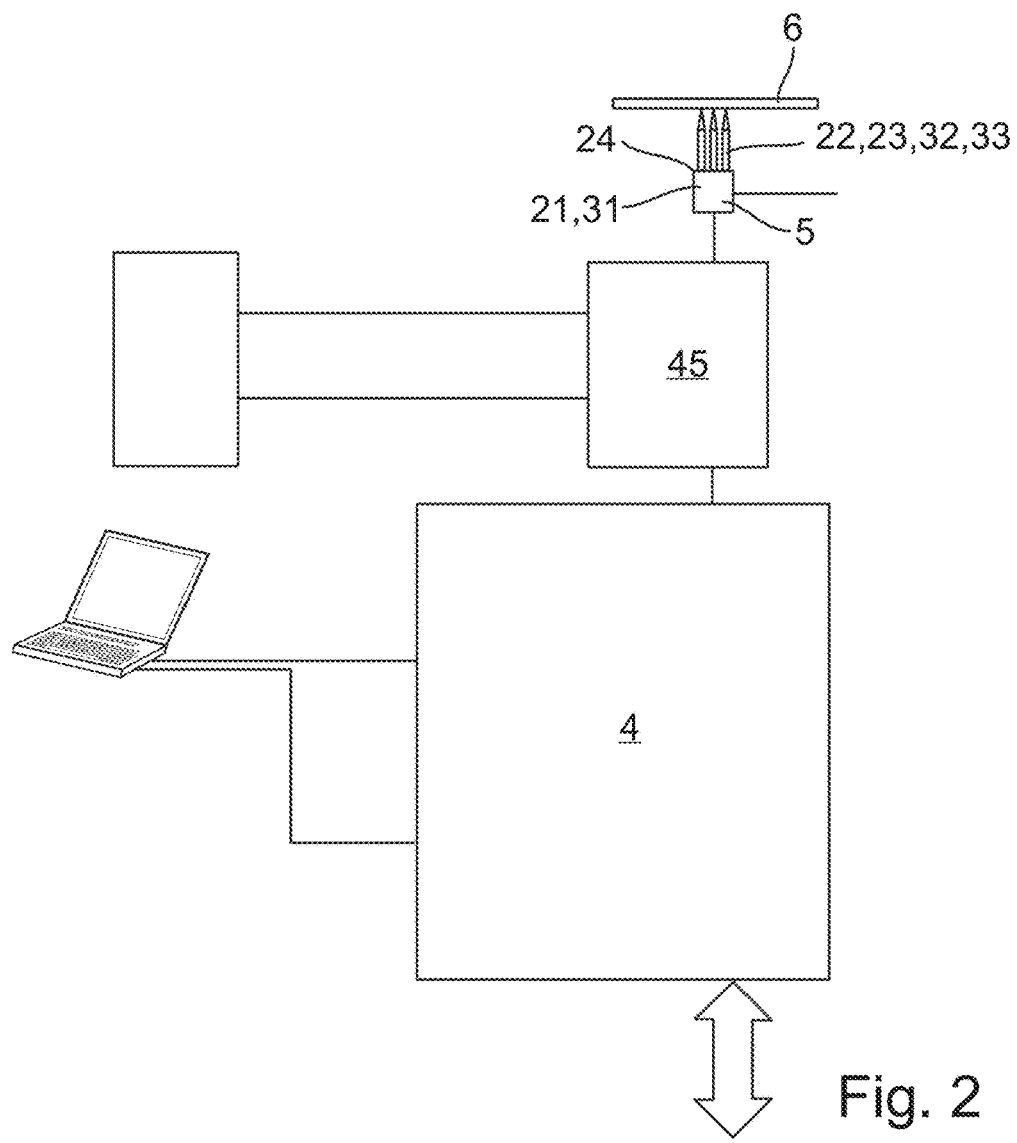
FIG. 2 shows, according to the invention, a schematic representation of a test module as part of the test system.

FIG. 2 schematically shows an aforementioned test module 4 in connection with the communication interface 5. This test module 4 is preferably used for communication from the test system 1, for example in connection with a computer with circuit board 6 to be tested. In addition, however, it may also be useful to tap measurement data from the printed circuit board to be tested via the communication module 5 and to forward it to the measuring electronics of the test system. This is done via changeover contacts on the test module 4.

These changeover contacts allow the use of the test module 4 for communication, for forwarding the measured data or for mixed operation.

Via the transformer module 45, which also has changeover contacts, additional data sources via the communication module 5 can be connected directly to the circuit board 6 to be tested. Control signals, which preferably come from the test system 1, for example, control the switching of relays on the transformer module 45.

Figure 6A:
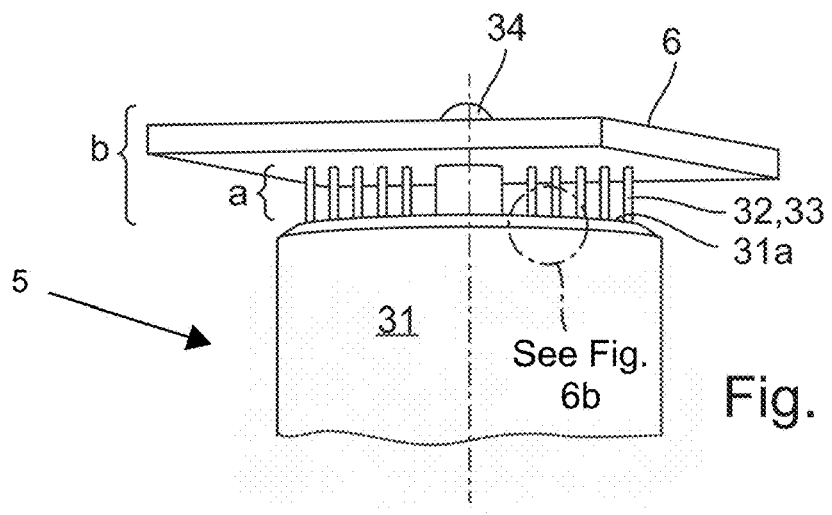
FIG. 6a shows a schematic representation of a contacting arrangement of a printed circuit board for data exchange with a communication interface of a test system.

The communication interface 5 of FIG. 6a preferably also has a housing section 31 and a plurality of contact tips 32 in an array arrangement 33. In the center, a pin 34 is arranged, which is spring-loaded and sinks into contact with the printed circuit board by a predetermined distance in the housing portion 31. This prevents damage to the printed circuit board 6 or damage to the contact tips when placing the array arrangement 33 on the printed circuit board 6.

An array arrangement 23 or 33 is referred to in the context of the invention, an arrangement of a plurality of contact tips 22 or 32, which put on a printed circuit board 6 at a fixed and defined distance from each other and make a data exchange at contact points.

In the simplest case, three contact tips are used. This already allows a data transmission to be made possible by the so-called SPI bus system (Serial Peripheral Interface). In this case, a first contact tip 22 or 32 is required for data feed, a second contact tip 22 or 32 for data return and a third contact tip 22 or 32 for a reference potential.

Additional functionalities can be added by adding further contact tips. A further reference potential can thus be tapped. A galvanic separation can also be made possible. A power supply of the circuit board, with one or more voltages, can follow. Further, one or more simulations may be performed, e.g., by transmitting a control command through a contact tip 22 or 32. Furthermore, a measurement value test of a component of the printed circuit board 6 can be carried out by a contact tip 22 or 32 in response to the transmitted control command. A further contact tip 22 or 32 can serve as an indication line for testing the operational readiness of the components of the printed circuit board 6.

By means of the communication interface 5, the Ethernet connection of the printed circuit board in front of the communication module for the Ethernet connection can be checked by contacting with the contacting regions 11 of the printed circuit board 6.

Particularly preferably, the number of contact tips 22 or 32 per array arrangement 23 or 33 is nine or ten.

The above-described variants of a communication interface have the particular advantage that they can be positioned directly by the test module 4 and, starting from the test module 4, have short signal and power supply lines to the communication interface 5. This prevents data loss due to long transmission paths and also achieves exact signal generation and signal reception by the communication interface 5.

The contacting regions 11 represent the counterpart to the array arrangement 22 or 32 of the communication interface 5. The contacting regions 11 represent the counterpart to the array arrangement, for example of the communication interface. They are a closed metallic surface. A plurality of contacting regions 11, for example nine contacting regions 11, form a contacting arrangement 12. The contacting regions of the contacting arrangement 12 are spaced apart in the form of a pattern. These distances of a contacting region 11 are preferably always the same for each adjacent contacting region. The contacting areas are free of other components and/or solder resist or other coatings which could interfere with the data connection.

The contacting regions 11 of the contacting arrangement 12 of the printed circuit board 9 are preferably arranged in a circular pattern, preferably on at least two or more circular paths, or likewise preferably arranged in a rectangular pattern, preferably square, arranged on the printed circuit board 6.

Figure 7:
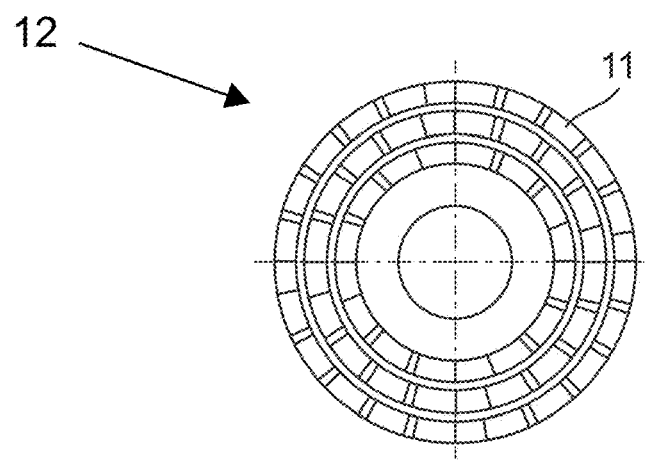
FIG. 7 shows a schematic representation of a second contacting arrangement on a circuit board for data exchange with a communication interface of a test system.
Figure 8A:
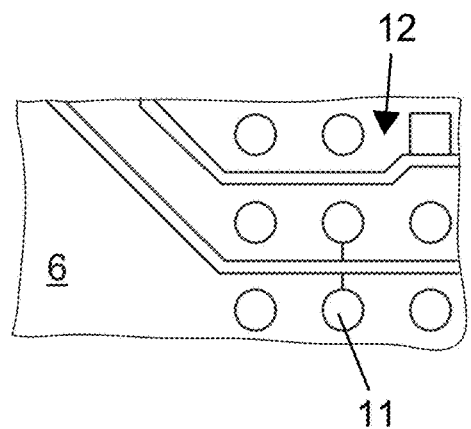
FIG. 8 shows, according to the invention, a schematic bottom view of the second variant of a communication interface of the test system, according to FIG. 5.
Figure 8B:
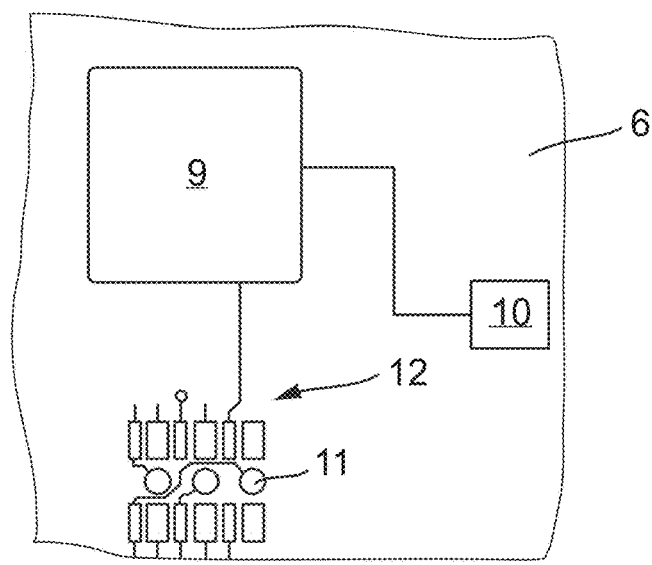

Corresponding patterns are shown in FIGS. 8a and 7.

Figure 6B:
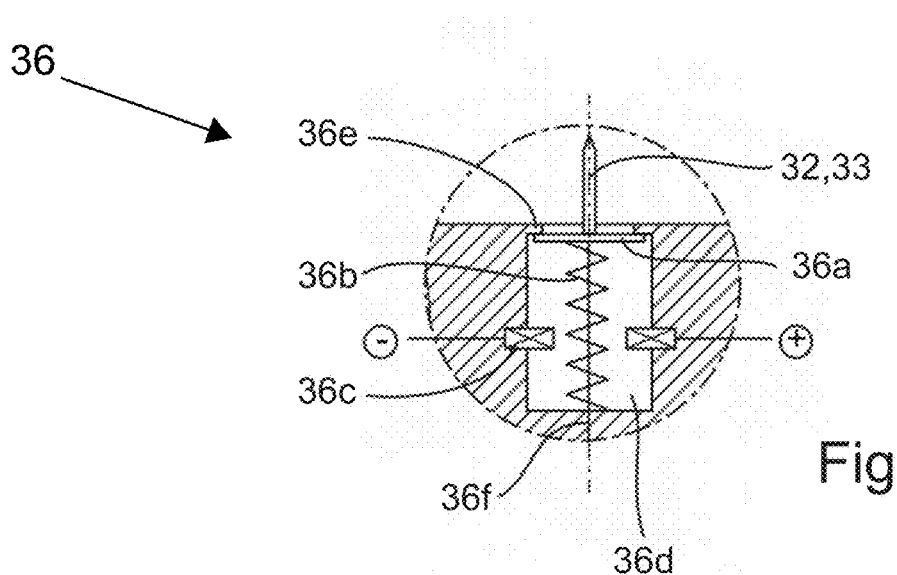
FIG. 6b shows a schematic representation of a holding device for extending and retracting contact tips of the communication interface.

FIG. 6b shows in detail a holding device 36 of a contact tip. This makes it possible to extend and retract contact tips from the housing of the communication interface. The holding device shown in FIG. 6b is only one of several variants to hold a contact tip in a retracted position in the housing. In this case, the contact tip 32 comprises a plate-shaped formation 36a. This is mounted movably in a channel 36d. A spring 36b presses against the formation 36a whose movement is limited by a stop 36e projecting into the channel. For holding in the retracted position, an electromagnet 36c is provided which attracts the plate of the contact tip upon activation of the electromagnet. Unless the solenoid 36c is activated, the contact tip is spring loaded only. From the contact tip, a cable 36f goes off, which serves for signal and/or energy transmission. The holding device is not limited to FIG. 6b but can also be used for all other variants of communication interfaces described above.

The contacting regions 11 are preferably gold-plated or tin-plated in order to provide a better data line between A corresponding contacting arrangement 12 is preferably arranged in the vicinity of the communication module 9 of the printed circuit board 6 on the communication path, so that the communication of the individual components of the printed circuit boards and loading of data, e.g. on the data memory of the circuit board, bypassing the communication module 9, that is for example the Ethernet socket, can be done.

A circuit board 6 to be tested with a communication module, which is designed as an Ethernet interface can be contacted in a test in a non-inventive way by any test system via a standard Ethernet socket with a communication interface of the test system.

In the context of the present invention, however, it is proposed that such a test takes place automatically, wherein the plug connection has proven to be expensive for this purpose via an Ethernet standard socket. Automated testing of such an Ethernet interface is not yet offered by established companies using automated test systems, e.g. for testing solder contacts.

The communication interface 5 can preferably have one or more components which are reproduced in the components of the communication module 9 of the printed circuit board 6. This component is arranged in the housing section 21 or 31 in FIGS. 4 and 5 and can be designed, for example, as a transformer module 45, also called a converter. Such a transformer module can preferably be a so-called Ethernet Magnetic Transformer. A corresponding transformer module is usually also integrated in an Ethernet plug, which, however, can be bypassed by contacting the communication interface 5 with contact areas 11 of a contacting arrangement 12 on the printed circuit board 6.

Thus, the communication module with the components without large signal loss before and after the transformation due to long data lines via the array arrangement 23, 33 are connected to the circuit board 6 and exchange data.

The functionally identical replication of the components of the communication module 9 of the circuit board by the components of the communication interface 5 of the test module 4 ensures reliable communication with the processor unit, the data memory and further components on the circuit board 6 to be tested, without it being important whether the bridged Ethernet socket of the circuit board 6 has no transformer module, a transformer module or a plurality of transformer modules connected in series or parallel to one another.

After reading out the type of Ethernet socket on the circuit board by the test system, for example on the basis of a bar code on the circuit board, the test system can select a corresponding component circuit which corresponds to the interconnection of the Ethernet socket, so that an identical data exchange between the test system 1 and the circuit board 6 is made possible despite bridging, as if the test system is connected thereto via the Ethernet socket of the circuit board 6.

For example, a data exchange can take place at a typical data transmission rate of 10 to 100 Mbit/s.

Figure 8C:
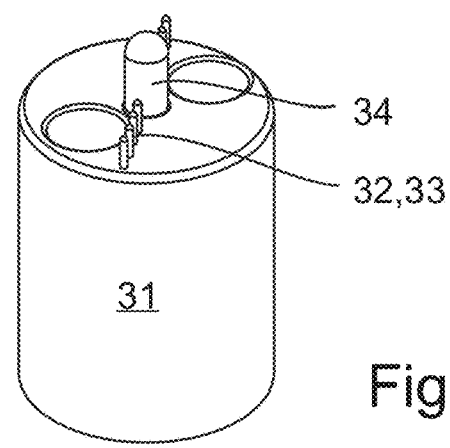

In FIGS. 6a and 8c a variant of an array arrangement 33 is arranged with the pin 34. In this variant, the pin is formed as a centering pin and spaced from each other along a radial line extending to this centering the contact tips 32 are arranged.

The contact tips 32 can be extendable and extended, for example, by means of a locking mechanism if necessary. Thus, depending on the type of component of the circuit board, the non-required contact tips 32 are retracted.

The type of component can be identified by means of a barcode located on the printed circuit board, which can be identified by means of a camera 13 located on the test module 4. Depending on the specification of the barcode, the communication interface 5 and the associated components as well as further components of the test module 4 can then be operated and, in particular, put in readiness.

The retractable contact tips require less space on the circuit board to be tested for contact areas 11 so that the material of the printed circuit board can be saved and an optimized component arrangement on the printed circuit board is achieved.

The centering by the centering pin can interact in particular with an arrangement of contact areas 11 on a printed circuit board 6, as shown in FIG. 8c.

Furthermore, it is advantageous if the array arrangement, i.e. the arrangement of the pin-like metallic contact tips 22, 32, is arranged rotatably about an axis defined by the centering pin. Thus, the pin-like contact tips may better approach the contact areas 11 and contact with them, that is, the number of contact areas 11 may advantageously be reduced. The rotatability of the array arrangement is also advantageous in rectangular array arrangements of the contact tips, such as e.g. in FIG. 4.

Figure 12:
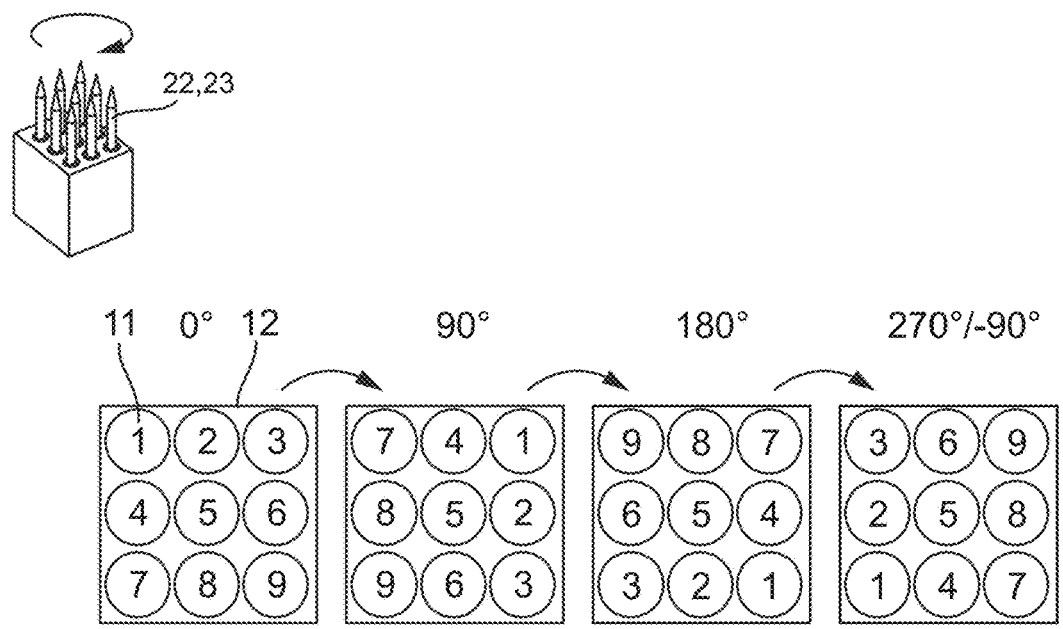
FIG. 12 shows a schematic representation of a rotating communication interface.

The rotatability of the array arrangement 23, 33 as shown in FIG. 12 and FIG. 8c is also advantageous, since in this way printed circuit boards 6 with different orientation, i.e. a supply in the longitudinal or transverse direction of the printed circuit board, are supplied and tested in the test system 1 without having to position the circuit board by rotation. Rather, by rotation of the array arrangement 23, 33 whose position peaks 22, 32 are aligned after the orientation of the circuit board. A rotation of the printed circuit board or a supply to the test system from a non-optimal direction therefore has no consequences for the test and the transmission of data.

The rotation of the array arrangement, for example by rotatable mounting of the array arrangement, can thus advantageously be implemented in the scope of the present invention both for a rectangular array arrangement of the contact tips and for a linear arrangement of the contact tips.

Figure 13:
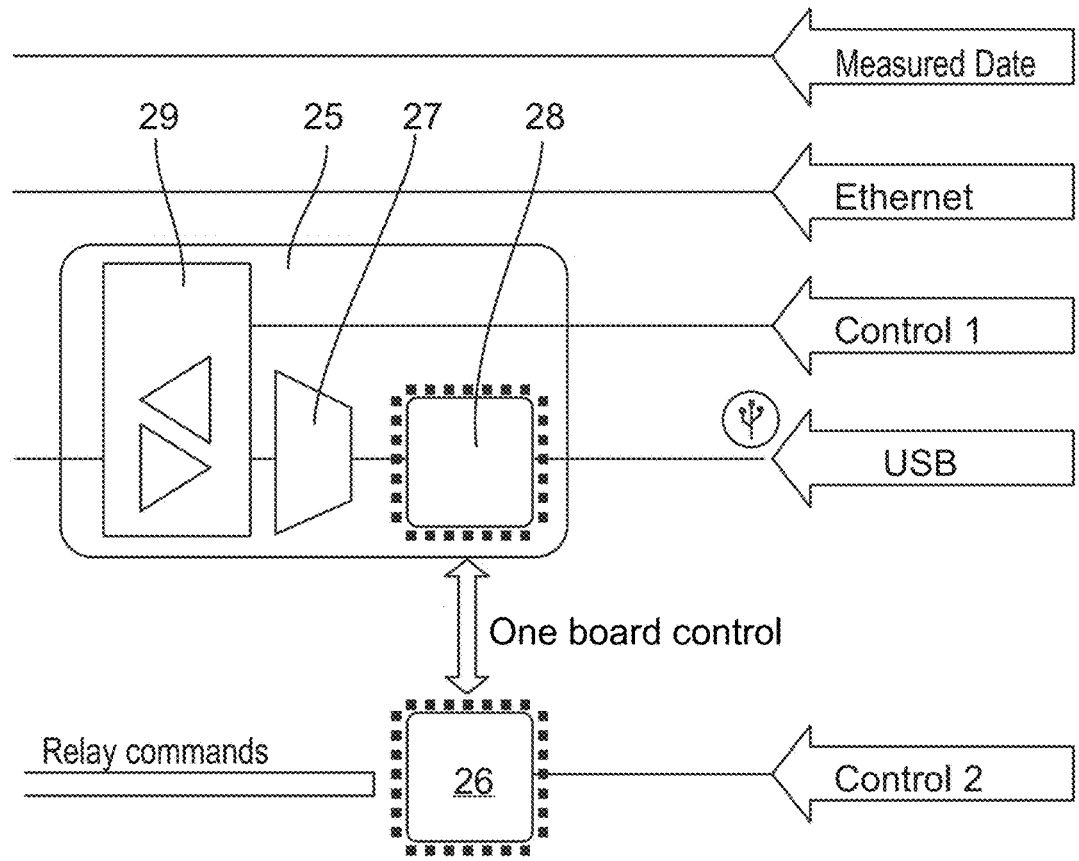
FIG. 13 shows a schematic representation of a realization with different communication protocols.

By storing different data sets the test module 4 can communicate via different communication protocols with the circuit board 6 to be tested and the communication modules 9 and data memory 10 located thereon, as shown in FIG. 13. Thus, depending on the type of communication, individual feeding of communication protocols can take place and optionally changeover between the communication types. For this purpose, no further systems are possible but the data transmission can take place during the superficial examination of the solder joints and electronic components.

As a result, different communication protocols can be applied to printed circuit board 6 to be tested by the test system as required and/or the printed circuit board 6 can be checked for the presence of these communication protocols. Such communication protocols are, for example, I2C, SPI, USB, Ethernet, Profibus and/or UART.

The levels of the drivers are preferably adjustable via a software stored on the data memory or a logic module of the test module 4 or directly via the test system 1. Thus, the test module 4 can communicate not only with different communication protocols via the communication interface 5 but also can adapt the voltage level of the communication signals to the level of the circuit board 6 to be tested.

Furthermore, a self-diagnostic program is stored on the data memory or the logic module of the test module 4 with which a diagnosis of the test module 4 and the communication interface 5 can take place and can be carried out by a processor or a logic module of the test module 4.

In the context of the present invention, the communication interface 5 is referred to as a first component for functional testing, by means of which by transmitting and receiving communication data to the printed circuit board 6, the correct data transmission of the printed circuit board 6, in particular a processor unit associated with the printed circuit board 6, which manages a data memory, is tested by the test system 1. Further components which can preferably be used in the context of the present invention are described below.

The test module 4 has at least one or more second components within the scope of the present invention, which has a support element 18 for spacing between the printed circuit board 6 and the test module 4 and optionally for supporting the circuit board 6 against deflection.

A third component which can be arranged on the test module 4 is a camera 13 for image acquisition in the visible spectral range. This camera 19 can perform various functions.

It can serve for determining the position of the printed circuit board 6 to be tested.

Alternatively or additionally, it can also examine the printed circuit board 6 to be tested for the presence of components with which the printed circuit board should be equipped.

The camera 13 may also alternatively or additionally detect a bar code or a serial number on the circuit board 6 and the circuit board based on this bar code can initiate and capture specific records and control programs from a data store. Among other things, this may include special specifications for examining the printed circuit board 6, or the components arranged thereon, or the extent of the data which is to be transmitted to the data memory of the printed circuit board 6 with the aid of the communication interface.

The camera 13 can also make an examination of solder joints in terms of presence.

Additional functions, such as further diagnostic functions, can additionally be performed by the camera.

A fourth component of the test module 4 may comprise, for example, a metallic pin-shaped probe 20, e.g. for testing the solder contacts arranged on the underside by resistance measurement, but unlike the test probes 2 which are brought from above the circuit board 6, may be arranged rigidly with the test module 4 or movably only in one direction, in particular extendably, on the test module 4. This reduces the mechanical complexity of this metallic test tip 20.

As an alternative or in addition to mechanical functions or diagnostic functions by means of the above-mentioned component or components, it is also possible exclusively to load data, e.g. of communication protocols by the communication interface 5. By loading the data onto the data memory 10 of the circuit board 6 to be tested at the same time during the testing of the solder joints, e.g. through the test probes 2, a time saving is achieved while the quality control is carried out.

The loading of the data can be done, for example, as a kind of basic programming. The circuit board 6 to be tested can be used in particular in a measuring device of automation technology. Data can be transferred to the data memory 10 as a function of the respective measuring device, the field of application of the measuring device and the production line during the production of the measuring device. The data transmission can be specifically from the assembly of the printed circuit board, so that data for controlling, checking and/or identification of the individual components or assemblies of the printed circuit board 6 can be transferred from the data store of the test module 4 via the communication interface 5 and the communication module 9 to the data memory 10 of the printed circuit board.

Alternatively or in addition to the above-mentioned components, the test module 4 can also comprise one or more tool components 50, for example a soldering element 51 for forming a solder or pliers 52. Other tool components, e.g. screwdrivers and the like may also be provided. By controlling the tools, a simple repair of the printed circuit board 6 to be tested can take place in a time-sequential sequence for the detection of a defect by the upper test probes 2 or the removal of placement aids can take place.

In addition, the test module 4 can also have a current and/or voltage source for supplying power to the tool components or the components for functional testing.

The test system 1 has the data memory 35 with a corresponding test program stored thereon. This test program controls the use of the support element 18, the contact tips 22, the test tip 20, and/or possibly further tools 50, 51, 52 and their positioning. As a result, different printed circuit boards 6 to be tested can be tested with different distances between the components and supplied with data.

In addition to the soldering point tests carried out on the upper side by the test probes 2, a functional test of individual components by the test module 4 takes place in the variant according to the invention of the present invention.

The aforementioned components of the test board 4 may be arranged individually or particularly preferably together on the test module 4. The latter is an advantage, as a specified distance is maintained.

As a result of the movability of the test module 4 below the circuit board 6 in the x, y and z-direction, the respective components of the circuit board to be tested can also be functionally tested at the same time as the quality control of the connections of the electronic components with the lines of the circuit board. This leads to time savings and a spatial saving of an additional test system.

A further aspect of the present invention is the voltage and/or power supply of the test module 4 and the components connected thereto, i.e. the communication interface 5 as well as the circuit board 6 to be tested, but also further components, e.g. tool elements such as forceps or soldering elements or one or more cameras. In previously known test systems, the voltage is supplied by a current and/or voltage source of the test system, that is to say spatially remote from the test piece or printed circuit board 6 to be tested.

According to the concept of the present invention, the current and/or voltage source 14 is part of the test system 1 and in particular a component of the test module 4. This prevents a voltage drop caused by long lines 17. The power and/or voltage source can be controlled by a control unit 15 according to a program or by manual input from the control unit 15.

The test system 1 itself is limited by a housing 16. While the test module 4, and the communication interface 5 and the current and/or voltage source 14 is movably disposed in the housing, the control unit 15 is preferably arranged rigidly in or on the housing 16 of the test system 1 or outside of this housing 16.

In a particular embodiment of the invention, the contact tips 22, 32 are connected directly to the current and/or voltage source 14 via a power supply line. The current and/or voltage source 14 can be supplied with energy from the outside, i.e. outside the housing 16 of the test system 1 and can also be adjusted externally with control commands to a voltage output value.

By means of the control unit 15, the voltage supplied to both the test module 4 and in particular the communication interface 5, or the current supplied to the test module 4 and in particular the communication interface 5 can be adjusted or both the supplied current and the supplied voltage can be adjusted. Thus, in particular, the contact tips 22 32 can be operated with a current having a predetermined voltage and/or a predetermined current intensity.

As a current and/or voltage source 14 is referred to in the context of the present invention, a component which generates a discrete smaller voltage and/or current value from a larger voltage or a larger current regardless of the size of the supplied voltage or current.

To test which voltage value arrives at the contact tips 22 or 32, the current and/or voltage source 14 can preferably be connected to the contact tips via a readout line, a so-called sense line. In the present current and/or voltage source 15, the output voltage or a portion thereof is compared with a reference voltage and thus adjusted such that even in case of varying load the output voltage on the circuit board to be tested 6 remains constant. However, this state is usually present only in the ideal case. Therefore, the voltage to be compared with the reference voltage in the vicinity of the load, that is, at the contact tips 22 or 32 is thus determined behind the leads with the fluctuating voltage drop by means of the read-back line. The voltage drop on the supply lines is thereby compensated and the voltage at the load, that is, at the contact tips of the communication interface 5, remains constant even in real cases. The aforementioned line can be generated by connecting in parallel with the voltage input of the respective contact tip, so that the current and/or voltage source 14 compensates for the voltage drop of the line resistance. The voltage generated by the current and/or voltage source 14 can consequently be adapted after adjustment with the read-back values. Thus, the voltage drop through the conduction path between the contact tips 22, 32 and the current and/or voltage source 14 can be compensated and possibly also voltage fluctuations are compensated.

Overall, the power supply can be controlled by the current and/or voltage source by a program, which is preferably stored on the data memory of the test module 4. A preferred type of programmable voltage source is also known as LDO (low-drop-out voltage regulator) and can be used in the context of the present invention as a preferred form of a current and/or voltage source 14.

The current and/or voltage source 14 is designed so that it can react and compensate extremely quickly for changes in load on the circuit board to be tested, preferably in the range of a few nanoseconds. This is preferably required if the circuit board 6 to be tested is a component with fast microprocessors with fast communication and memory components which have dynamic load changes.

This function is preferably realized by means of modules with fast control properties and/or with capacitors which can bridge very short energy peaks.

The current intensity values can also be read out in a further preferred variant of the invention and limited by comparison with a stored data record. This data record can also preferably be stored on the data memory of the test module 4 and/or the control unit 15.

Figure 10:
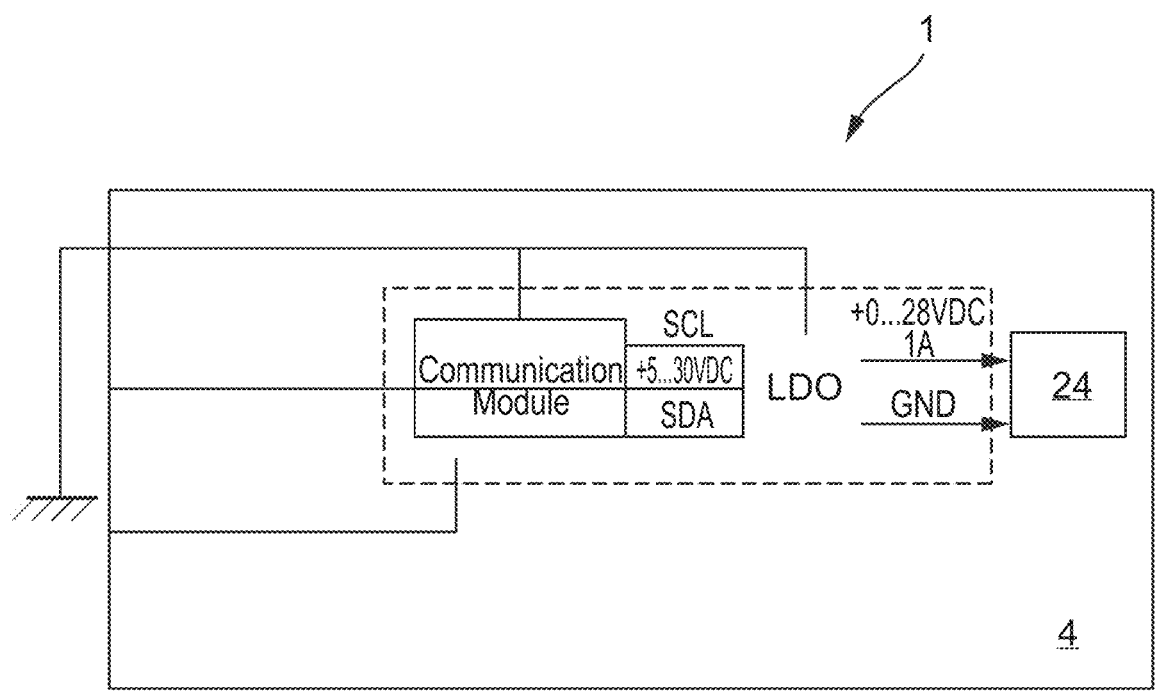
FIG. 10 shows a schematic representation of a circuit diagram of an LDO voltage source with the test module.
Figure 11:
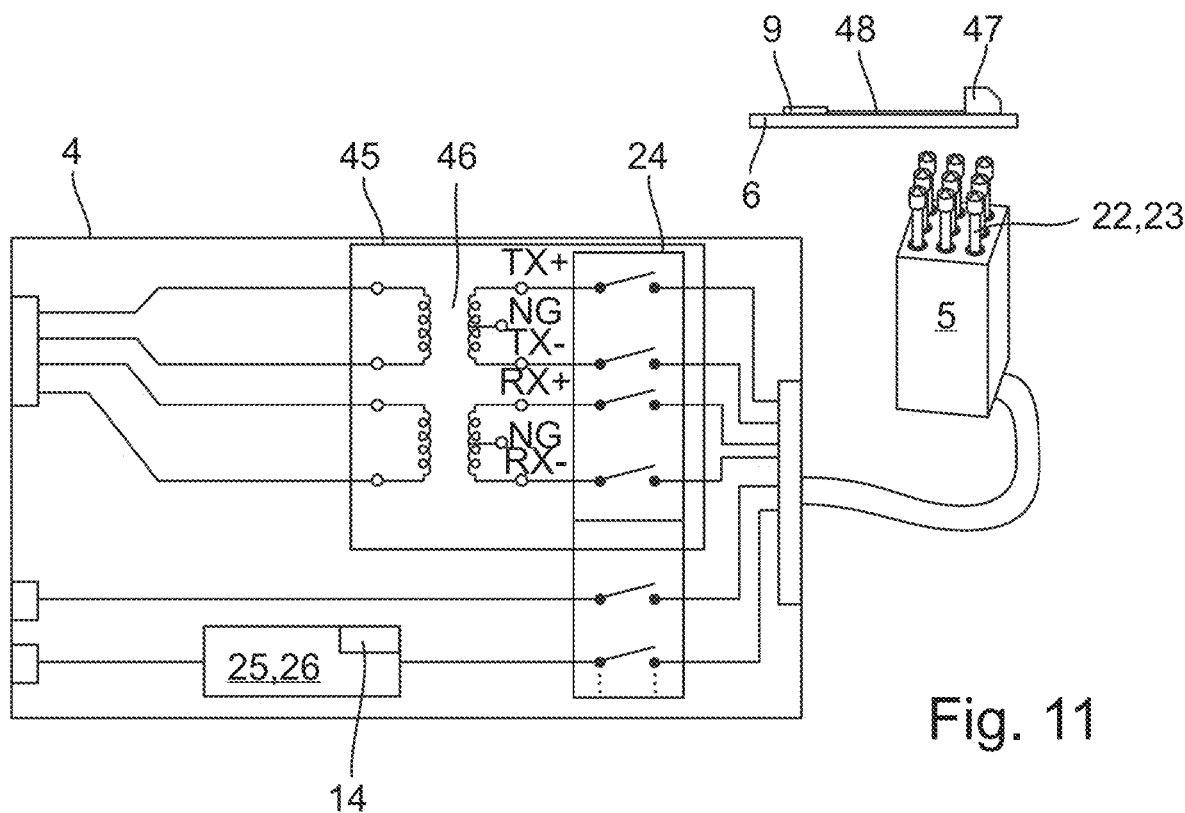
FIG. 11 shows a schematic representation of a transformer module for an Ethernet communication.

A circuit diagram for a preferred current and/or voltage source 14 is shown in the diagram of FIG. 10. It shows: The LDO shown in FIG. 10 is a so-called low drop out voltage regulator. The communication module is a communication module which controls the LDO and represents the connection to the test system 1. The LDO may be located on the test module 4 or the communication interface 5. FIG. 10 shows a localization on the test module 4.

Figure 9:
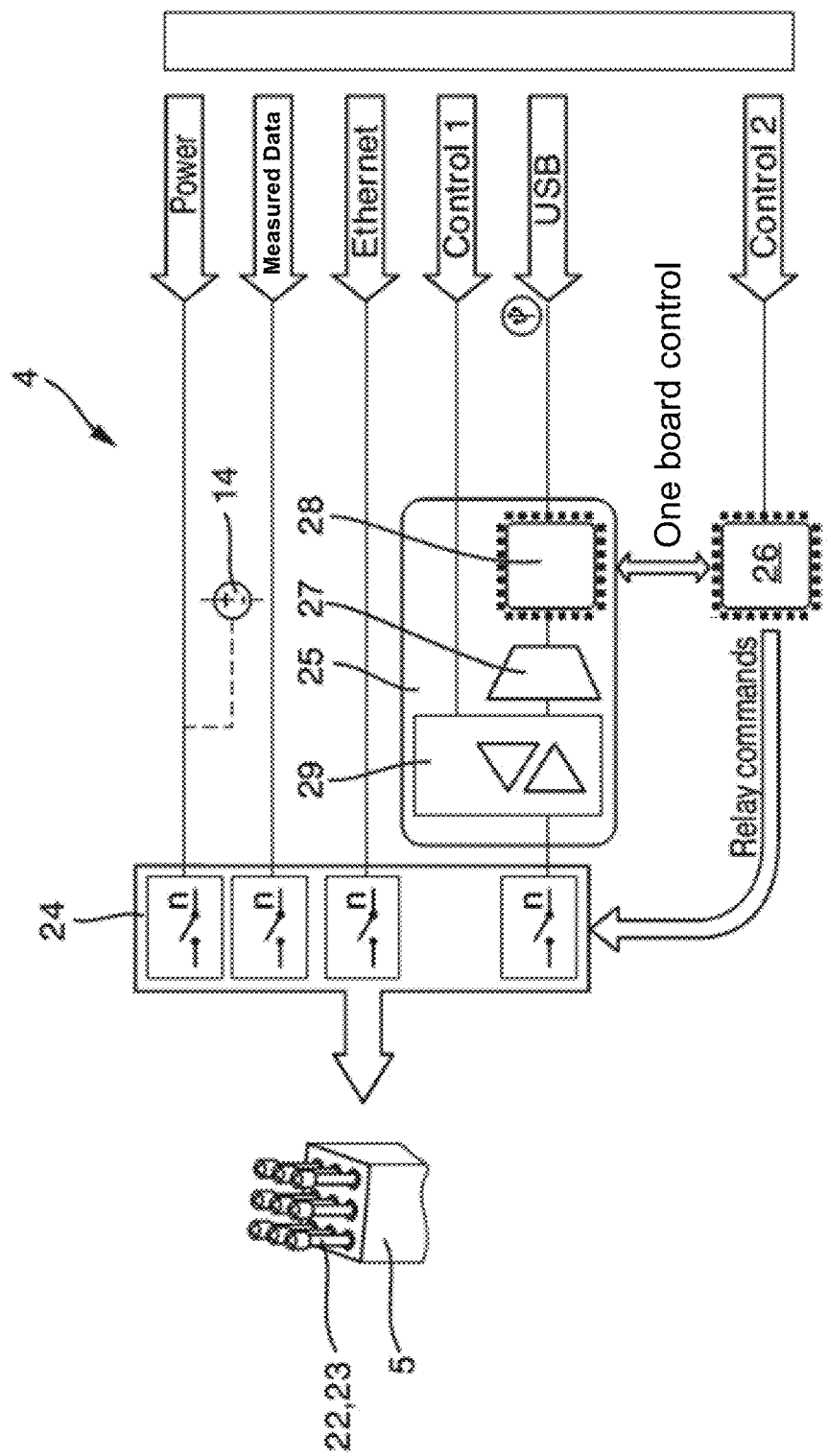
FIG. 9 shows, according to the invention, a circuit diagram of an arrangement of several components of a test module with communication interface of the test system.

FIG. 9 shows the essential components of the communication module 4. The core forms the communication unit 25. It represents the various communication protocols and/or a converts a protocol, for example USB, coming from the test system a different protocol. A multiplexer 27 (mux) downstream of the communication chip 28 can switch the individual communication signals to any contact tips 2, 32 of the communication interface 5. This in turn brings flexibility in the design of the contact points 7 and the array 23 on the circuit board 6 to be tested. The multiplexer 27 (MUX) may be followed by a driver/sensor 29, which can adjust the signal levels of the communication signals. Thus, the flexibility of the communication unit 25 is increased because it can adapt to different signal levels and thus to different voltage technologies of the circuit board 6 to be tested.

Furthermore, the driver/sensor 29 can also include a sensor that measures the current via the communication lines and, in the case of deviations, triggers an error message or performs a shutdown. The control of the communication chip 28, the multiplexer 27, the driver/sensor 29 and the downstream relay matrix 24 is represented by a logic module 26 which is in turn connected to the test system. The logic module 26 can be realized by an FPGA, a microcomputer or another chip with logic functions. An additional relay matrix 24 expands the flexibility of the test module 4 in that it offers the possibility of switching a plurality of signal sources, voltage supplies, communication interfaces and measurement data as well as the interface signals from the communication unit 25 to any contact tip 2, 32 of the communication interface 5. This also applies to the current/voltage source 14 of the test module 4 but also to supply units of the test system 1 as connected to the test module 4. In this case, a mixed or combinational interconnection is conceivable. The relay matrix 24 can also be controlled from the control unit 26.

The transformer module 45 is preferably a component of the test module 4 and can be connected via the communication interface 5 to a printed circuit board 6 to be tested. The circuit board to be tested contains a communication module 9 which preferably supports Ethernet or Profinet communication. Magnetics 46 i.e. transformers or transducers, of the transformer module 45 are dimensioned such that a galvanic separation to the communication module 9 is realized and an electrical adaptation can be represented in the sense of an Ethernet connection. In addition the Magnetics 46 of the transformer module 45 are calculated in such a way, that an Ethernet/Profinet communication with 100 Mbit/s is possible, regardless of whether or not a so-called Ethernet socket is mounted with the communication module 9 via an electrical connection 48. It is also irrelevant whether or not an Ethernet socket 47 mounted on the circuit board 6 to be tested by design contains Magnetics.

In addition to the above-described components, the test module 4 can also have a thermography system, preferably in the form of an infrared camera 130 or a temperature sensor, preferably a non-contact temperature sensor. However, the variant of the temperature sensor is less preferred because of the lower detection range of the temperature measurement. By contrast, the infrared camera permits a temperature measurement of individual components of a printed circuit board 6 to be tested and their connection to the printed circuit board 6. The temperature measurement of the IR camera can be done by the free positioning of the test module 4 with the IR camera 30 along the surface of the circuit board 6 to be tested at certain preferred locations. The temperature measurement can preferably be carried out without contact. Alternatively or in addition to the temperature measurement by the infrared camera, a test probe provided with a temperature sensor can also carry out a temperature measurement by contacting it with the printed circuit board. However, this variant requires a higher constructive and control-mechanical outlay associated with a more time-consuming measurement compared to the IR camera.

Figure 3:
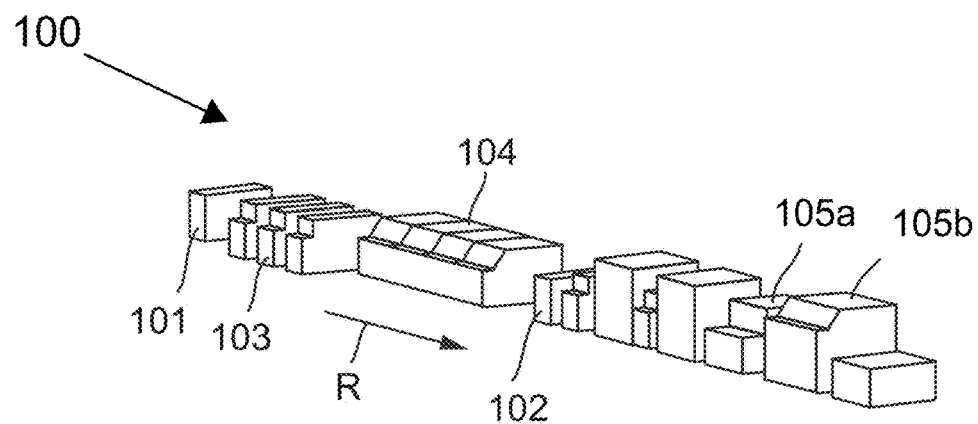
FIG. 3 shows, according to the invention, a schematic representation of a production line for producing a printed circuit board with a test system 1 integrated in the production line

FIG. 3 shows a production line 100 for producing and testing printed circuit boards 6 according to the invention, which can preferably be used in measuring devices of automation technology, e.g. in measuring sensors or in transducers.

The production line 100 has a station 101 for providing a printed circuit board basic body, also called a panel. The circuit board base body can already have conductor lines.

The production line has a transport device 102, for example a conveyor belt, with which the printed circuit board main body in the transport direction R is transported from station to station.

Starting from the station 101 in which the circuit board base body is provided, the latter is transported further to a station 103 for equipping the printed circuit board base body with electronic components, wherein at least one of these components being an intelligent component which is designed, for example, as a communication module 9 for communication with other electronic devices remote from the printed circuit board. Another intelligent component is a central processor unit which is part of the circuit board 6 to be tested and which manages the data of the data memory 10. The printed circuit board 6 is formed from the printed circuit board base body. The cartridge can be fitted e.g. using previously applied circuit board base body mounted masks.

Following station 103 for assembly, the printed circuit board is transported by the printed circuit board 6 into a soldering furnace 104. Here, the soldering of the electronic components to the circuit board base body takes place.

After passing through the soldering furnace 104, a final control of the finished printed circuit board 6 is performed by the test system 105a and 105b. In this case, the test system 105a performs a simultaneous control a) of the electrical contacting of the soldering points between the components and the printed circuit board and b) a functional testing of one or more of the intelligent components, such as the communication module 9.

The aforementioned functional testing preferably comprises a functional testing of the communication module 9, a programming, and/or a check of the programming of the data memory 10 of the printed circuit board 6, a control of the data line from the communication module to the central processing unit of the circuit board 6.

The complex checking of data on the data memory, the processor unit and the communication module cannot be performed by individual probes as they are introduced from the top of the circuit board. For this purpose, the above-described communication interface 5, preferably with the above-described configurations of the respective array arrangements 23 or 33, requires a plurality of contact tips 22 or 32.

The invention claimed is:

1. A test system for checking electrical soldered connections between electronic components on a circuit board to be tested, comprising:
   a housing;
   an assembly movably mounted in the housing, wherein the assembly is designed as a communication interface including three electrically conductive contact tips, which, by making contact with a contact-making arrangement on the circuit board having a plurality of contact points, allow a data exchange with a data memory of the circuit board to be tested, wherein the data exchange takes place according to a communication protocol; and
   a current and/or voltage source for supplying power to the circuit board to be tested, wherein the current and/or voltage source is disposed in the housing and is movable in at least two spatial directions inside the housing.

2. The test system according to claim 1, wherein the assembly is designed as a test module.

3. The test system according to claim 2, wherein the current and/or voltage source is part of the test module.

4. The test system according to claim 1, wherein the communication interface is fixedly connected to a test module which is movably arranged in at least two spatial directions in the housing of the test system.

5. The test system according to claim 4, wherein the test module and the communication interface are mounted on the underside of the circuit board to be tested.

6. The test system according to claim 1, wherein the current and/or voltage source is arranged at a discrete distance from the three contact tips, and a readout line extends between the current and/or voltage source and at least one of the three contact tips to compensate for conduction resistances and voltage fluctuations.

7. The test system as claimed in claim 1, wherein the current and/or voltage source can be controlled with regard to an output voltage.

8. The test system as claimed in claim 1, wherein the current and/or voltage source can be controlled with regard to a current limitation.

\* \* \* \* \*